United States Patent
Kosaraju et al.

(10) Patent No.: US 10,148,174 B2
(45) Date of Patent: Dec. 4, 2018

(54) DUTY CYCLE ESTIMATOR FOR A SWITCH MODE POWER SUPPLY

(71) Applicant: QUALCOMM Incorporated, San Diego, CA (US)

(72) Inventors: Ajay Kumar Kosaraju, Singapore (SG); Guolei Yu, Singapore (SG); Yi-Cheng Wan, Singapore (SG); Sugato Mukherjee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 156 days.

(21) Appl. No.: 15/348,923

(22) Filed: Nov. 10, 2016

(65) Prior Publication Data

US 2017/0279352 A1 Sep. 28, 2017

Related U.S. Application Data

(60) Provisional application No. 62/314,354, filed on Mar. 28, 2016.

(51) Int. Cl.
*H02M 3/157* (2006.01)
*G01R 19/165* (2006.01)
(Continued)

(52) U.S. Cl.
CPC ...... *H02M 3/157* (2013.01); *G01R 19/16571* (2013.01); *H02M 1/08* (2013.01);
(Continued)

(58) Field of Classification Search
CPC .............. H02M 3/157; H02M 1/08; H02M 2001/0009; H02M 2001/0032; H02M 2001/0025
See application file for complete search history.

(56) References Cited

U.S. PATENT DOCUMENTS 4,577,097 A * 3/1986 Keyes, IV ............. G05B 11/42
250/214 R
7,884,586 B2 2/2011 Fabbro
(Continued)

FOREIGN PATENT DOCUMENTS

WO 2004006037 A2 1/2004
WO 2015111006 A1 7/2015

OTHER PUBLICATIONS

International Search Report and Written Opinion—PCT/US2017/022197—ISA/EPO—dated Jun. 20, 2017.
(Continued)

*Primary Examiner* — Jue Zhang
*Assistant Examiner* — Lakaisha Jackson
(74) *Attorney, Agent, or Firm* — Qualcomm Incorporated/Seyfarth Shaw LLP; Alan M. Lenkin

(57) ABSTRACT

A duty cycle estimation circuit includes a latch circuit that receives a clock signal for a voltage regulator. The latch circuit outputs a duty cycle estimate. The duty cycle estimation circuit also includes a low pass filter coupled to an output of the latch circuit to receive the duty cycle estimate. The duty cycle estimation circuit further includes a comparator that receives, as input, an output of the low pass filter and a voltage regulator output. The comparator feeds back a feedback signal to the latch circuit.

22 Claims, 8 Drawing Sheets

(51) Int. Cl.
　　　*H02M 1/08*　　　(2006.01)
　　　*H02M 3/156*　　(2006.01)
　　　*H02M 1/00*　　　(2006.01)

(52) U.S. Cl.
　　　CPC .. *H02M 3/1563* (2013.01); *H02M 2001/0009* (2013.01); *H02M 2001/0032* (2013.01)

(56) References Cited

U.S. PATENT DOCUMENTS

| | | | |
|---|---|---|---|
| 9,595,869 B2* | 3/2017 | Lerdworatawee | H02M 3/158 |
| 9,641,060 B2* | 5/2017 | Tang | H02M 1/00 |
| 2004/0062336 A1* | 4/2004 | Kuwata | H03L 7/081 |
| | | | 375/376 |
| 2004/0178783 A1* | 9/2004 | Uematsu | H02M 3/157 |
| | | | 323/282 |
| 2011/0156687 A1 | 6/2011 | Gardner et al. | |
| 2012/0286691 A1 | 11/2012 | Jesme | |
| 2014/0009130 A1 | 1/2014 | Galbis et al. | |
| 2015/0340942 A1* | 11/2015 | Tang | H02M 1/00 |
| | | | 323/282 |
| 2016/0329734 A1* | 11/2016 | Lee | H02M 3/156 |
| 2017/0222554 A1* | 8/2017 | Jatavallabhula | H02M 3/158 |

OTHER PUBLICATIONS

Li Y., et al., "Smart Duty Cycle Control with Reinforcement Learning for Machine to Machine Communications", 2015 IEEE International Conference on Communication Workshop (ICCW), Jun. 8-12, 2015, pp. 1458-1463.

Lukic Z., et al., "Self-Tuning Sensorless Digital Current-Mode Controller with Accurate Current Sharing for MultiPhase DC-DC Converters", Applied Power Electronics Conference and Exposition, 2009, APEC 2009, Twenty-Fourth Annual IEEE, Feb. 15-19, 2009, pp. 264-268.

Moreira C., et al., "Implicit Current DC-DC Digital Voltage-Mode Control", IEEE 23rd International Symposium on Industrial Electronics (ISIE), Jun. 1-4, 2014, pp. 1378-1383.

* cited by examiner

DUTY CYCLE ESTIMATOR FOR A SWITCH MODE POWER SUPPLY

CROSS-REFERENCE TO RELATED APPLICATION

The present application claims the benefit of U.S. Provisional Patent Application No. 62/314,354, filed on Mar. 28, 2016, entitled "DUTY CYCLE ESTIMATOR," the disclosure of which is expressly incorporated by reference herein in its entirety.

BACKGROUND

Technical Field

The present disclosure generally relates to integrated circuits (ICs). More specifically, the present disclosure relates to a duty cycle estimator of a switched mode voltage regulator for improved load current sensing during discontinuous operation mode.

Background

Many modern electronic systems rely on one or more batteries for power. The batteries are recharged, for example, by connecting the system to a power source (e.g., an alternating current (AC) power outlet) via a power adapter and cable. As these modern electronic systems, including mobile computing devices (e.g., smart phones, computer tablets, and the like) continue to be used more widely, the need for increased battery capacity becomes more significant. Unfortunately, the amount of time a mobile device can operate on a fully charged battery is in conflict with increasing consumer demand for more features and smaller devices.

SUMMARY

In an aspect of the present disclosure, a duty cycle estimation circuit is presented. The duty cycle estimation circuit includes a latch circuit that receives a clock signal for a voltage regulator. The latch circuit also outputs a duty cycle estimate. The duty cycle estimation circuit also includes a low pass filter coupled to an output of the latch circuit to receive the duty cycle estimate. The duty cycle estimation circuit further includes a comparator that receives, as input, an output of the low pass filter and a voltage regulator output. The comparator feeds back a feedback signal to the latch circuit.

In another aspect of the present disclosure, a method of estimating a duty cycle is presented. The method includes comparing an averaged high side transistor voltage with a reference voltage. The method further includes determining an estimated duty cycle of a voltage regulator based on the comparing. The method further includes estimating a load current of the voltage regulator according to the estimated duty cycle.

In yet another aspect of the present disclosure, a duty cycle estimation circuit is presented. The duty cycle estimation circuit includes a means for generating a duty cycle estimate. The duty cycle estimation circuit also includes a low pass filter coupled to an output of the generating means to receive the duty cycle estimate. The duty cycle estimation circuit further includes a comparator that receives, as input, an output of the low pass filter and a voltage regulator output. The comparator feeds back a feedback signal to the latch circuit.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
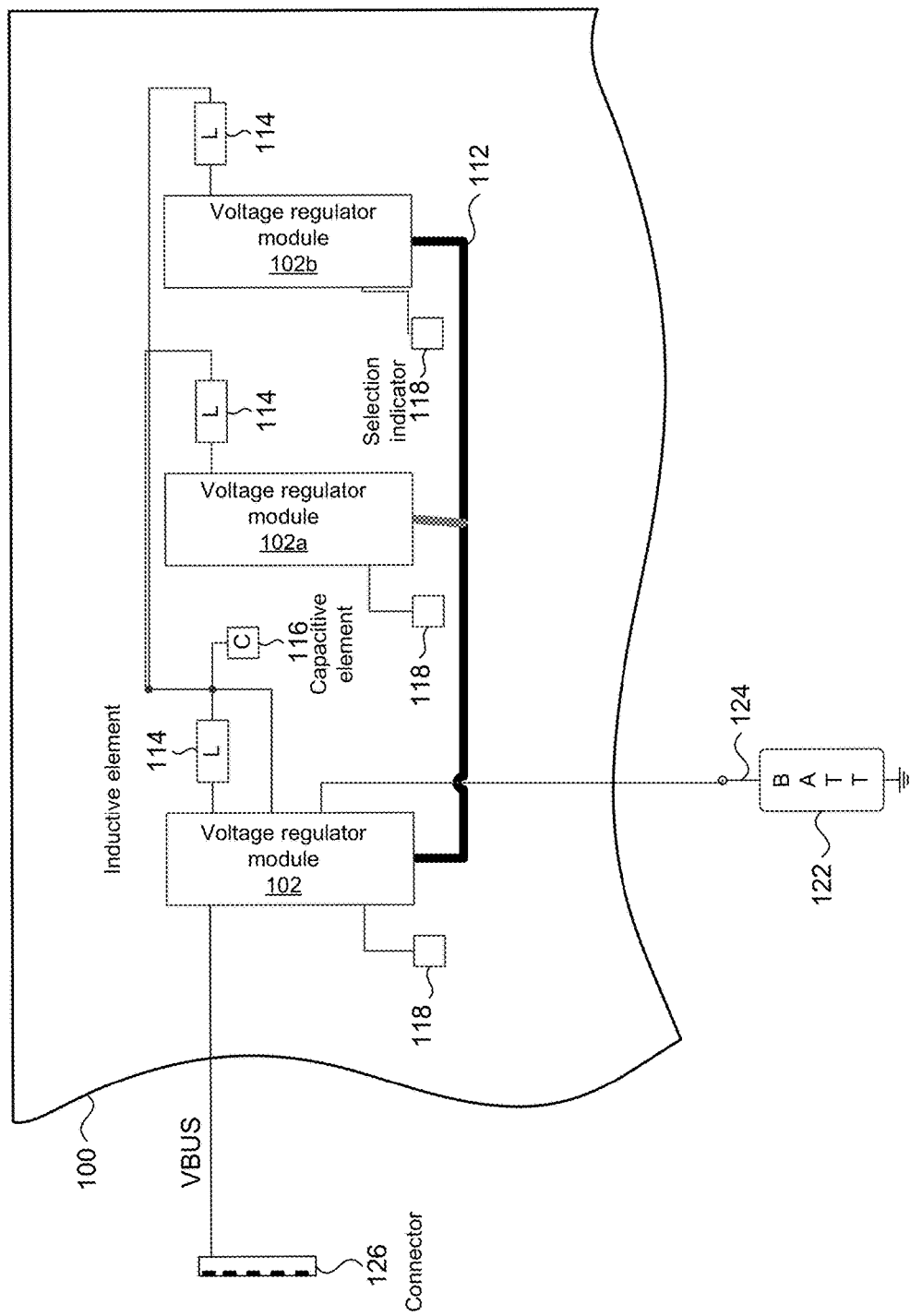
FIGS. 1A and 1B are schematic diagrams of printed circuit board (PCB) level arrangements according to aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR". Any reference to values is exemplary only and is intended to be non-limiting.

The term "coupled" used throughout this description means connected, whether directly or indirectly through intervening connections (e.g., a switch), electrical, mechanical, or otherwise, and is not necessarily limited to physical connections. Additionally, the connections may be such that the objects are permanently connected or releasably connected. The connections may also be through switches.

Many modern electronic systems rely on one or more batteries for power. The batteries are recharged, for example, by connecting the system to a power source (e.g., an alternating current (AC) power outlet) via a power adapter and cable. As these modern electronic systems, including mobile computing devices (e.g., smart phones, computer tablets, and the like) continue to be used more widely, the need for increased battery capacity becomes more significant. Unfortunately, the amount of time a mobile device can operate on a fully charged battery is in conflict with increasing consumer demand for more features and smaller devices.

A mobile device generally includes a voltage regulator to generate a regulated voltage for driving the power supply rails of the integrated circuits of the mobile device. The voltage regulator is designed to meet the load voltage and/or current regulation specifications of the device. The voltage regulator is also designed to provide protection for the load and the system of the device during component failure. In a mobile device, the voltage regulator generates an output voltage and a load current using a battery as an input power source.

A buck converter is one exemplary type of switching voltage regulator that may be used to step-down an input voltage ($V_{IN}$) to an output voltage ($V_{OUT}$). In a buck converter, the input voltage $V_{IN}$ (e.g., 12 volts) is greater than the output voltage $V_{OUT}$ (e.g., 3.3 volts). Switching voltage regulators, such as buck converters, generally operate in a charging mode, in which a passive device (e.g., an inductor) is charged to drive a load, and a discharge mode in which the passive device is discharged.

As will be recognized, inefficient use of a switching voltage regulator in a mobile device may quickly consume battery power. In particular, the ability to efficiently detect idle operation of a mobile device enables early entry into a power savings mode. Early entry into the power savings mode sustains battery power. Sustained battery power increases mobile device runtime for meeting the noted increased consumer demand for additional features and smaller devices.

Reducing power consumption within the voltage regulator of a mobile device is an important feature for reducing battery power consumption. For example, accurately sensing the load current for transition from normal power mode to low power mode will improve the efficiency of the system and save precious battery power. The transition from normal power mode to low power mode can be continuous conduction mode or discontinuous conduction mode. Sensing load current requires duty cycle information and it is not readily available in discontinuous conduction mode. Accuracy of the load current depends on the accuracy of the duty estimated. This may be especially significant when operating at a high frequency with a lower duty cycle. Deciding whether a voltage regulator is operating in normal power mode or low power mode is generally determined by detecting the average load current of the voltage regulator.

For example, during continuous mode operation of the voltage regulator, the duty cycle (D) of the voltage regulator is available from a switch node voltage (Vsw) signal of the voltage regulator as an average output voltage ($V_O$) divided by an input voltage ($V_{IN}$) ($D=V_O/V_{IN}$). During discontinuous operation mode, however, the duty cycle determined from the switch node voltage $V_{SW}$ signal is not equal to $V_O/V_{IN}$. Aspects of the present disclosure are directed to determining the duty cycle ($D=V_O/V_{IN}$) to estimate a load current ($I_{OUT}$). Expediting accurate detection of load current $I_{OUT}$ of a voltage regulator may save precious battery power, thereby increasing an amount of time the mobile device operates in a power savings mode.

Aspects of the present disclosure describe a duty cycle estimator of a voltage regulator for improved load current sensing during discontinuous operation mode. A duty cycle estimation circuit of the voltage regulator may include a combinational logic circuit (e.g., a latch circuit) that generates a rising edge of a duty cycle pulse in response to assertion of a voltage clock signal. The duty cycle estimation circuit also generates a falling edge of the duty cycle pulse in response to assertion of an input voltage feedback signal based on an input voltage of the voltage regulator.

In this configuration, the duty cycle estimation circuit also includes a filter coupled to an output of the combinational logic circuit to further enable estimation of the duty cycle. The filter generates a voltage ramp signal with a full voltage equal to an output voltage clock signal. In some aspects, the voltage ramp signal may have a slope that is proportional to an input voltage of the voltage regulator. The duty cycle estimation circuit further includes a comparator that asserts the input voltage feedback signal when the voltage ramp signal equals an output voltage of the voltage regulator. A controller may determine a duty cycle of the voltage regulator according to the duty cycle pulse. Once the duty cycle D is determined, the load current $I_{OUT}$ may be estimated. In this aspect of the present disclosure, the controller uses the estimated load current $I_{OUT}$ to determine whether to transition from normal power mode to low power mode. Improved power efficiency is achieved by changing the operating mode of a voltage regulator using an estimated load current $I_{OUT}$, in which sensing accuracy of the load current $I_{OUT}$ is achieved by accurately estimating the duty cycle D in discontinuous mode.

FIG. 1A shows a portion of a printed circuit board (PCB) 100 populated with a voltage regulator in accordance with the present disclosure. The PCB 100 may be a circuit board, for example, in a mobile computing device, a smart phone, and in general any electronic device. The PCB 100 may be populated with battery charging devices 102a and 102b and a voltage regulator module 102.

A voltage regulator module 102 is a device configured to maintain a constant voltage level. An external inductive element 114 may include combined inductance of the voltage regulator module 102 (or a surface mount technology inductance, or inductance caused by surface mount technology) in addition to parasitic inductance from a printed circuit board (not shown). An external capacitive element 116 may include the combined capacitance from the voltage regulator module 102 and any decoupling capacitance from any nearby components. The external inductive element 114 may include any trace inductance from the overall device near the external inductive element 114.

In some configurations, the battery charging devices 102a and 102b are identical devices that can be configured for different modes of operation. For example, the voltage regulator module 102 may be configured for "master" mode operation, while battery charging devices 102a and 102b may be configured for "slave" mode operation.

An output device (not shown) may be any device that would receive power, or that would benefit from a power delivery network, such as a two-stage power delivery network. For example, in one implementation, an output device may be a modem, an application processor or any such similar device. In one implementation, the output device is implemented as a die.

In accordance with principles of the present disclosure, the voltage regulator module 102 and the battery charging devices 102a and 102b may be connected to a battery 122 via a connection 124 (e.g., battery terminal) for coordinated charging of the battery by the battery charging devices. The battery 122 may comprise any known configuration of one or more cells (e.g., a single-cell configuration, a multi-cell, multi-stack configuration, etc.) and may be use any suitable chemistry that allows for recharging.

In some configurations, the voltage regulator module 102 operates as a buck converter, and in other configurations, buck-boost converters. In some configurations, the inductive component of the buck converter may be provided as an external inductive element 114 on the PCB 100. The external inductive elements are "external" in the sense that they are not part of the charging ICs that include the voltage regulator module 102 and the battery charging devices 102a and 102b. In accordance with the present disclosure, the capacitive component of the buck converters may be provided as the external capacitive element 116 on the PCB 100 that can be shared by the voltage regulator module 102 and the battery charging devices 102a and 102b. The noted capacitive elements are "external" in the sense that it is not part of the charging ICs that include the voltage regulator module 102 and the battery charging devices 102a and 102b.

Further in accordance with the present disclosure, the voltage regulator module 102 and the battery charging devices 102a and 102b may be connected to a selection indicator 118 to configure the device for master or slave mode operation. Each selection indicator 118 is "external" in the sense that it is not part of the charging IC that includes the devices. In some configurations, the selection indicator 118 may be a resistive element. For example, a connection to ground potential (e.g., approximately 0Ω) may serve to indicate the device (e.g., 102) should operate in master mode. A non-zero resistance value (e.g., 10KΩ, 100KΩ, etc.) may serve to indicate that the device (e.g., 102a, 102b) should operate in slave mode. Of course, these values are exemplary only and are intended to be non-limiting. More generally, in other configurations, the selection indicator 118 may be a source of a suitable analog signal or digital signal that can serve to indicate to the voltage regulator module 102 and the battery charging devices 102a and 102b, whether to operate in master mode or slave mode.

Power to the voltage regulator module 102 and the battery charging devices 102a and 102b may be externally provided via any suitable connector, such as the connector 126. Merely as an example, the connector 126 may be a USB connector. Power from the VBUS line of a USB connector may be connected to the voltage regulator module 102 (e.g., at a USBIN terminal), which may then distribute the power to the battery charging devices 102a, 102b via a MIDUSBIN terminal.

Figure 1B:
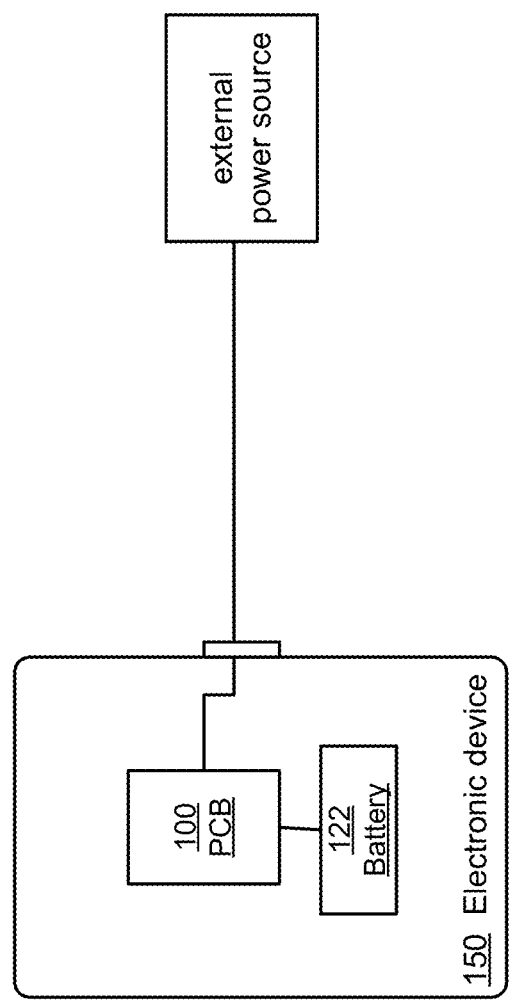

One of ordinary skill will appreciate that configurations according to the present disclosure may include any electronic device. For example, FIG. 1B points out that the PCB 100 may be incorporated in any electronic device 150.

Figure 2:
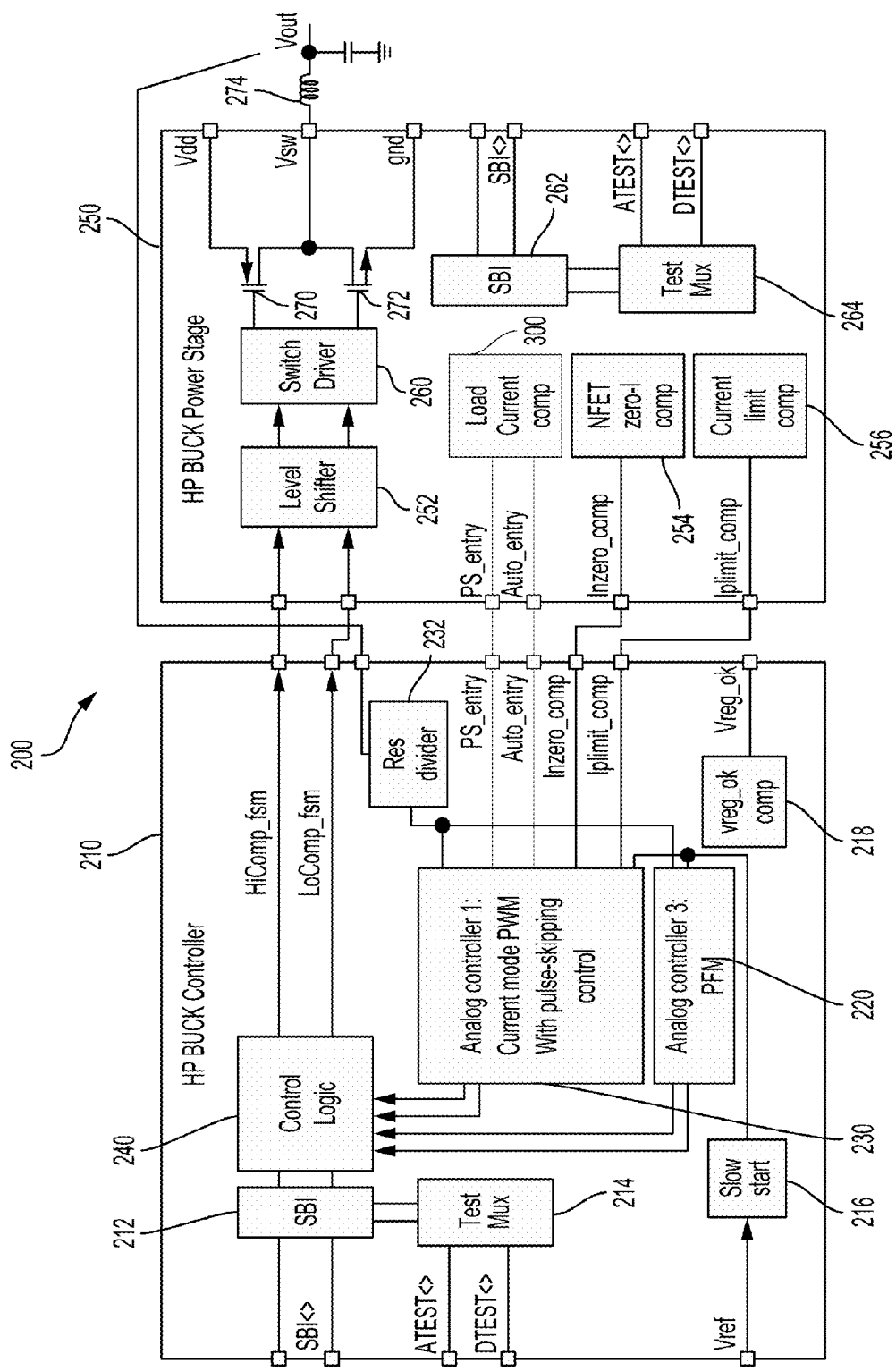
FIG. 2 shows a schematic representation of a mobile device including a buck controller and a buck converter power stage according to aspects of the present disclosure.

The discussion will now turn to details of a voltage regulator in accordance with some aspects of the present disclosure. FIG. 2 shows a schematic representation of a mobile device 200 including a buck converter controller 210 and a buck converter power stage 250 according to aspects of the present disclosure. It will be appreciated that in some implementations, the design of a voltage regulator for the mobile device 200, although described with reference to a buck converter, may be implemented using any switch mode power supply. For purposes of discussion, however, we can assume a buck DC/DC converter without loss of generality.

As shown in FIG. 2, the buck converter controller 210 includes control logic 240 coupled to a serial bus interface (SBI) 212 and a test multiplexer (MUX) 214 coupled to the SBI 212. The buck converter controller 210 also includes a pulse frequency modulated (PFM) controller circuit 220 (e.g., for a pulse frequency modulation (PFM) mode) and a pulse width modulated (PWM) controller circuit 230 (e.g., for a pulse width modulation (PWM) mode), each coupled to a slow start control block 216. The buck converter controller 210 further includes a divider circuit 232 (Res divider) and a voltage regulator comparison block 218 (vreg_ok comp).

The buck converter controller 210 is coupled to a buck converter power stage 250. During operation, the PFM controller circuit 220 or the PWM controller circuit 230 may direct the control logic 240 to assert high side and low side drive signals (HiComp_fsm, LoComp_fsm) to switch a high side transistor 270 and a low side transistor 272 of the buck converter power stage 250. The high side transistor 270 and the low side transistor 272 of the buck converter power stage 250 receive the high side and low side signals from a level shifter 252 through a switch driver 260. In operation, the switch driver 260 opens and closes the high side transistor 270 and the low side transistor 272 to charge and discharge an inductor 274 to generate an output voltage $V_{OUT}$. The high side transistor 270 and the low side transistor 272 may be implemented as field effect transistors (FET), such as n-type FETs (NFETs) or p-type FETs (PFETs).

The buck converter power stage 250 also includes a serial bus interface (SBI) 262 and a test multiplexer (MUX) 264 coupled to the SBI 262. The buck converter power stage 250 further includes an NFET comparator block 254 and a current limit comparator block 256 to control operation of the PWM controller circuit 230. The buck converter power stage 250 further includes a load current comparator block 300. The load current comparator block 300 generates a power savings entry (PS_entry) signal and an auto entry (Auto_entry) signal to control operation of the PWM controller circuit 230. For example, assertion of the Auto_entry signal may cause the buck converter controller 210 to enter a sleep mode for saving power. In addition, assertion of the PS_entry signal may direct the buck converter controller 210 to activate the PFM controller circuit 220 to operate according to a pulse frequency modulation mode to further reduce power consumption of the mobile device 200.

Figure 3:
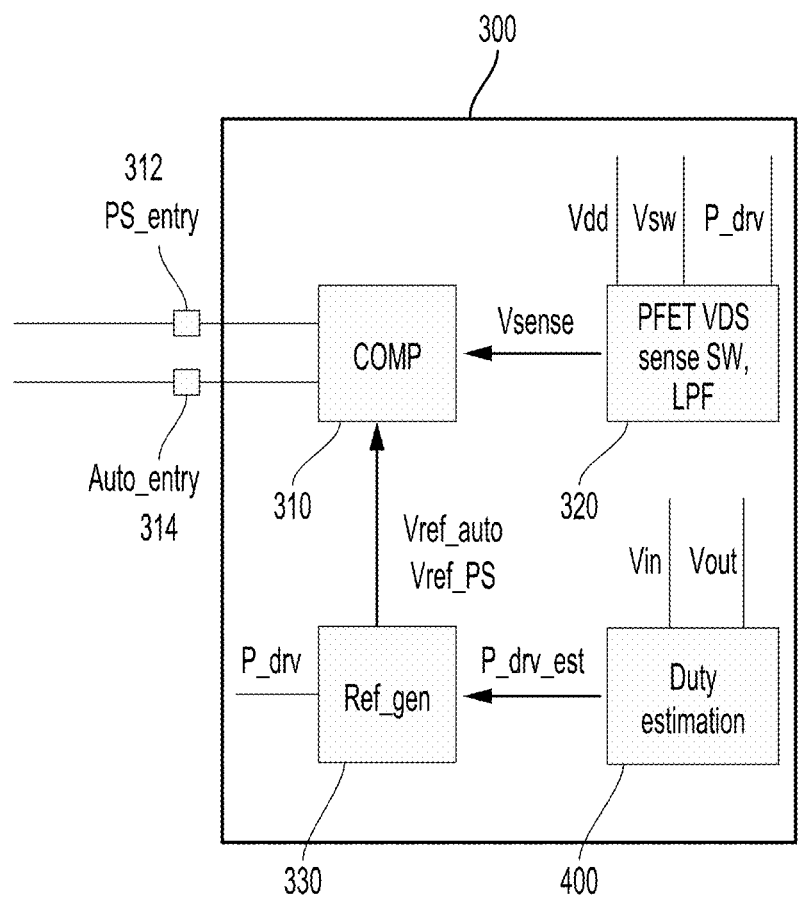
FIG. 3 shows a schematic representation further illustrating the load current comparison circuit of the buck converter power stage of FIG. 2 according to aspects of the present disclosure.

FIG. 3 shows a schematic representation further illustrating the load current comparator block 300 of the buck converter power stage 250 of FIG. 2 according to aspects of the present disclosure. In this arrangement, the load current comparator block 300 includes a comparator block 310 that compares a sensed voltage (Vsense) from a filter block 320 (PFET VDS sense SW, LPF) with an auto entry mode reference voltage (Vref_auto) and a power savings mode reference voltage (Vref_PS) from a reference generator block 330 (Ref_gen). Based on the comparison, the comparator block 310 asserts a PS_entry signal 312 to cause the buck converter controller 210 to enter sleep mode. In addition, the load current comparator block 300 may assert an Auto_entry signal 314 to direct the buck converter controller 210 to enter the pulse frequency modulation mode by activating the PFM controller circuit 220, while deactivating the PWM controller circuit 230 for reducing power consumption of the mobile device 200.

In this configuration, P_dry is the high side (HS) PMOS gate drive signal (e.g., high side transistor drive signal). In addition, P_drv_est is the estimated duty cycle signal, which is computed by sensing VDS of the HS PMOS switch, averaging the sensed VDS (e.g., averaged high side transistor voltage) and comparing it with a reference signal (e.g., reference voltage). The reference signal is generated by filtering a replica switch voltage with an ON period determined by the duty estimator and a reference current Iref. The filtered Vds of the PFET is D*Rsw*Iload, where Rsw is the PFET resistance and the filtered Vds of the replica switch is D*Rp*Iref where Rp is the replica switch resistance. As a result, Iload=Rp/Rsw*Iref. A duty cycle estimation circuit 400 of the load current comparator block 300 is further illustrated in FIG. 4.

Figure 4:
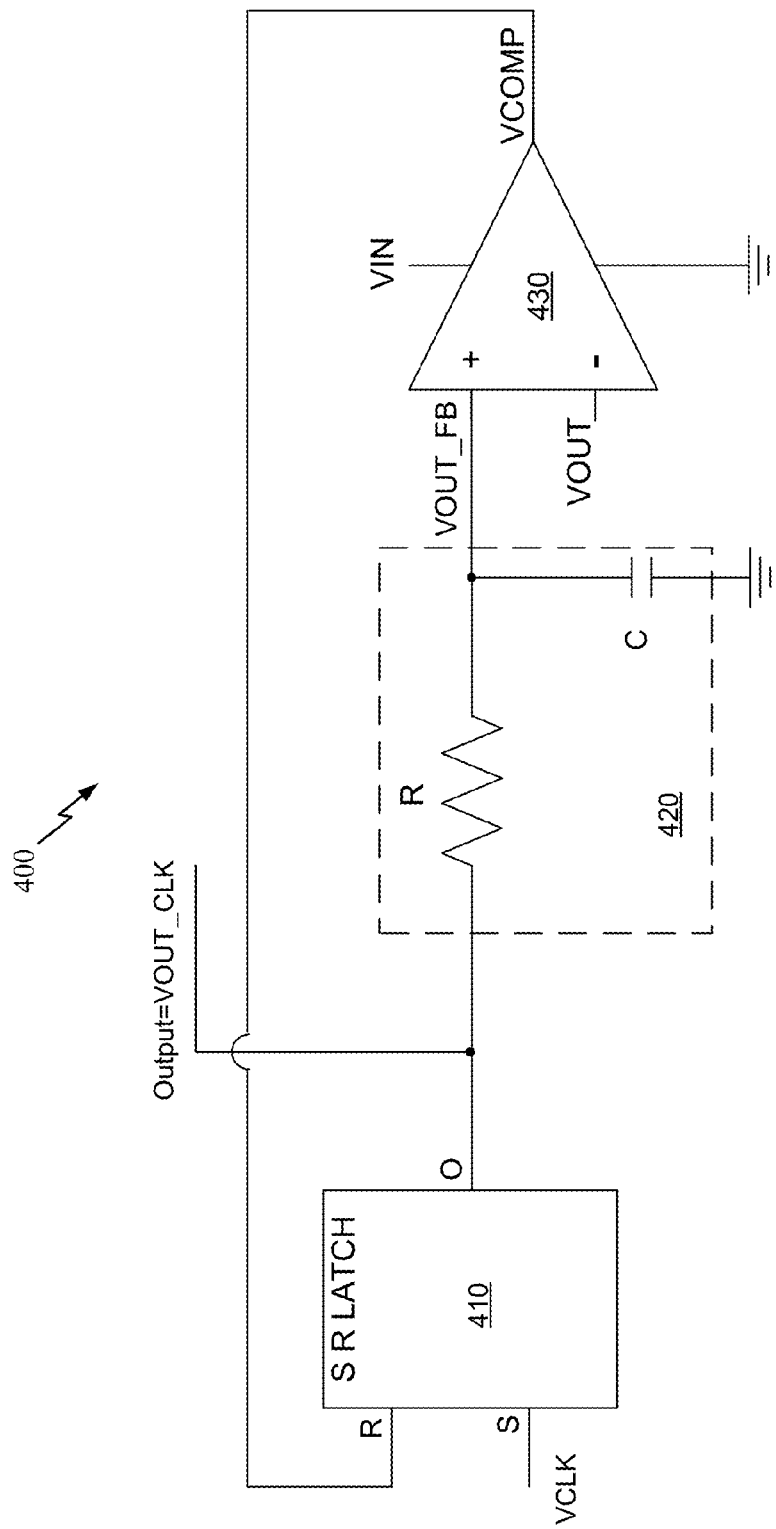
FIG. 4 shows a schematic representation further illustrating the duty cycle estimator circuit of the load current comparison circuit of FIG. 3 according to aspects of the present disclosure.

FIG. 4 shows a schematic representation further illustrating the duty cycle estimation circuit 400 of the load current comparator block 300 of FIG. 3 according to aspects of the present disclosure. In this arrangement, the duty cycle estimation circuit 400 enables reduction of power consumption within the buck converter controller 210 and the buck converter power stage 250 of the mobile device 200. Aspects of the present disclosure recognize that accurately sensing the load current to determine whether to transition from normal power mode to low power mode improves the efficiency of the system and saves precious battery power. The transition from normal power mode to low power mode can occur during continuous conduction mode or discontinuous conduction mode. Sensing load current requires duty cycle information and it is not readily available in discontinuous conduction mode. Accuracy of the load current depends on the accuracy of the duty estimated. This may be especially significant when operating at a high frequency with a lower duty cycle. Deciding whether the buck converter power stage 250 is operating in normal power mode or low power mode is generally determined by using an average load current of the voltage regulator.

During continuous operation mode, the inductor current does not drop below zero amps (0 A). During discontinuous operation mode, however, the load current drops below zero amps. Unfortunately, duty cycle information used to estimate the average load current of the buck converter power stage 250 may not be readily available during discontinuous operation mode. For example, during continuous operation of the buck converter power stage 250, the duty cycle of the voltage regulator is available from a switch node voltage (Vsw) signal of the buck converter power stage 250 because power is constant during continuous operation mode. As a result, assuming a duty cycle (D), a load current ($I_{OUT}$) and a supply current ($I_{VIN}$), the duty cycle D is computed as:

$$D = I_{VIN}/I_{OUT} \quad (1)$$

In addition, assuming a switch node voltage $V_{SW}$, an on-time interval ($T_{ON}$) within a switching period ($T_{SW}$), and an input voltage ($V_{IN}$), an average output voltage ($V_O$) is computed as follows:

$$V_O = AVG[V_{SW}] = (T_{ON}/T_{SW})*V_{IN} = D*V_{IN} \quad (2)$$

As noted by equation (2), duty cycle information is available from the switch node voltage $V_{SW}$ signal when the voltage regulator is operating in continuous mode. During discontinuous mode, however, the duty cycle determined from the switch node voltage $V_{SW}$ signal is not equal to $V_O/V_{IN}$. Aspects of the present disclosure are directed to determining the duty cycle during discontinuous mode, which may be used to determine the load current $I_{OUT}$ using equation (1). Expediting accurate detection of the estimated load current $I_{OUT}$ of the buck converter power stage 250 may save precious battery power, thereby increasing an amount of time a mobile device may operate in a power savings mode.

In this aspect of the present disclosure, the duty cycle estimation circuit 400 enables improved load current sensing during discontinuous operation mode. Representatively, the duty cycle estimation circuit 400 includes a combinational logic circuit 410 (e.g., a set reset (SR) latch) that generates a rising edge of a duty cycle pulse in response to assertion of a voltage clock signal (VCLK). The duty cycle estimation circuit 400 also generates a falling edge of the duty cycle pulse in response to assertion of an input voltage feedback signal (VCOMP) based on an input voltage (VIN) of the buck converter power stage 250.

In this configuration, the duty cycle estimation circuit 400 also includes a filter 420 (e.g., a low pass filter) coupled to an output (O) of the combinational logic circuit 410 to further enable estimation of the duty cycle. The filter 420 generates a voltage ramp signal (e.g., VOUT_FB) with a full voltage equal to an output voltage clock signal (VOUT_CLK). The duty cycle estimation circuit 400 further includes a comparator 430 that asserts the input voltage feedback signal VCOMP when the voltage ramp signal equals an output voltage (VOUT) (e.g., buck output) of the buck converter power stage 250. The filter 420 includes a resistor (R) and a capacitor (C), in which values of the resistor R and the capacitor C are selected so that an RC time constant of the filter 420 is greater than the switch period $T_{SW}$ of the voltage clock signal as follows to determine the duty cycle as follows:

$$\frac{VOUT}{VIN} = \frac{1 - e^{-\frac{DTsw}{RC}}}{1 - e^{-\frac{Tsw}{RC}}} \quad (3)$$

where D is the duty cycle and $T_{SW}$ is the period.

An average period may be 5 to 10 seconds, which may be based on a duty cycle output. Of course, these values are exemplary only, and are non-limiting. According to an aspect, the filter 420 acts as a memory to filter down the duty and correct its difference value, thus reducing error in an estimated duty cycle. Operation of the duty cycle estimation circuit 400 is further illustrated in the timing diagram of FIG. 5.

Figure 5:
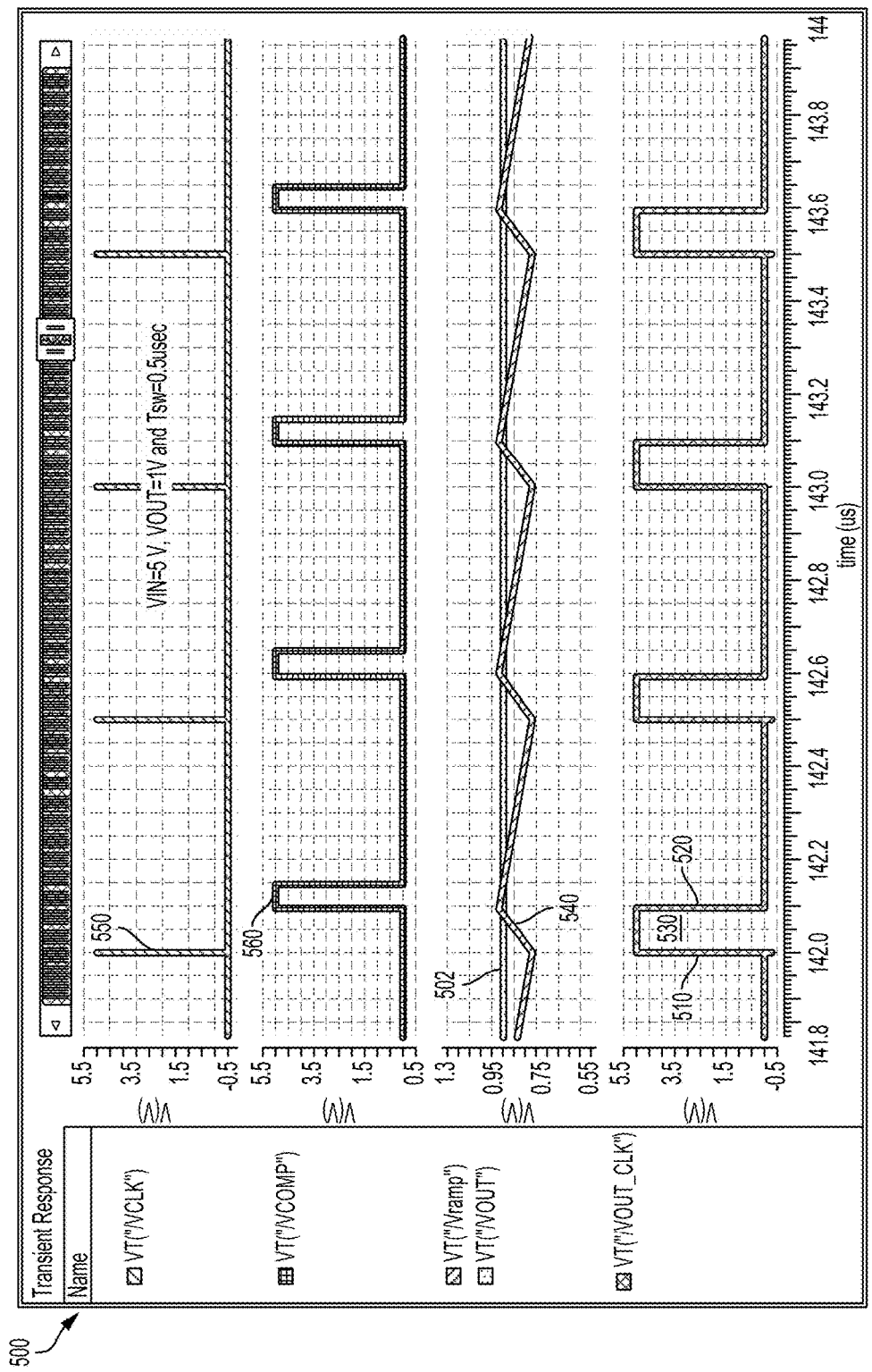
FIG. 5 is a timing diagraming illustrating generation of a duty cycle pulse by the duty cycle estimation circuit of FIG. 4 according to aspects of the present disclosure.

FIG. 5 is a timing diagram 500 illustrating generation of a duty cycle pulse by the duty cycle estimation circuit 400 of FIG. 4 according to aspects of the present disclosure. Representatively, a rising edge 510 of a duty cycle pulse 530 is also generated in response to assertion of the voltage clock signal VCLK 550. In addition, a falling edge of the duty cycle pulse 530 is generated in response to assertion of the input voltage feedback signal 560 (VCOMP) based on the out voltage 502 (VOUT) and a voltage ramp signal 540 (VOUT_FB). In this example, the input voltage $V_{IN}$ is five volts (5 V), the output voltage $V_{OUT}$ is one volt (1 V), and the period ($T_{SW}$) is 0.5 microseconds. Using equation (2), with the duty cycle D is ⅕(=$V_{OUT}/V_{IN}$), and $T_{SW}$ equal to 0.5 microseconds, $T_{ON}$ equals 100 nanosecond(=⅕*0.5 microseconds). In this example, the ON period $T_{ON}$ of the duty cycle pulse 530 is approximately 94 nanoseconds, resulting in approximately a 6% error for the actual ON period $T_{ON}$ of 100 nanoseconds. Of course, these values are exemplary only, and are non-limiting.

Figure 6:
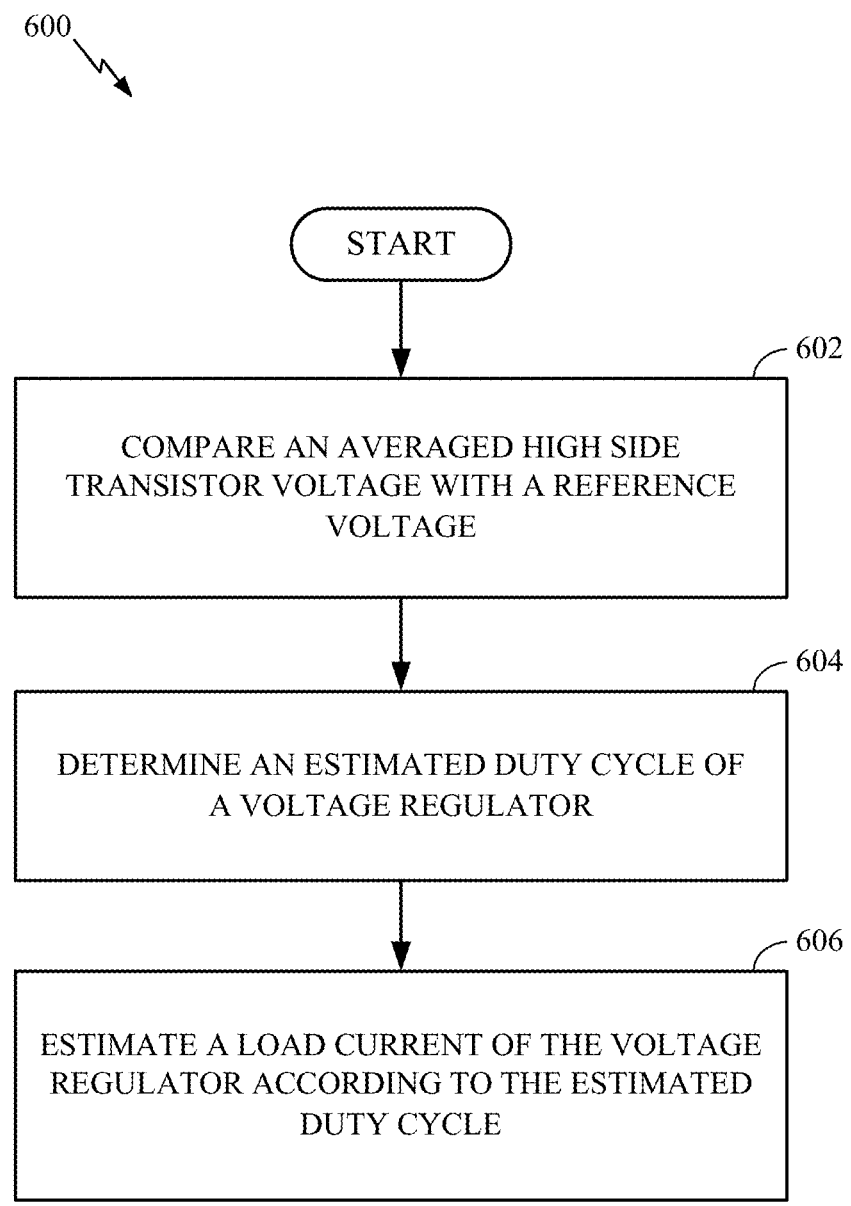
FIG. 6 is a process flow diagram illustrating a method of duty cycle estimation for a voltage regulator according to an aspect of the present disclosure.

FIG. 6 is a process flow diagram 600 illustrating a method of duty cycle estimation for a voltage regulator according to an aspect of the present disclosure. In block 602, an averaged high side transistor voltage is compared with a reference voltage. In block 604, an estimated duty cycle of the voltage regulator is determined. Determination of the estimated duty cycle of block 604 may be performed during a discontinuous operating mode of the voltage regulator. In block 606, a load current of the voltage regulator is estimated according to the estimated duty cycle.

Referring again to FIG. 3, P_drv is the high side (HS) PMOS gate drive signal. In addition, P_drv_est is the estimated duty cycle signal, which is computed by sensing VDS of the HS PMOS switch, averaging the sensed VDS (e.g., averaged high side transistor voltage) and comparing it with a reference signal (e.g., reference voltage). The reference signal is generated by filtering a replica switch voltage with an ON period determined by the duty estimator and a reference current Iref. The filtered Vds of the PFET is D*Rsw*Iload, where Rsw is the PFET resistance. The filtered Vds of the replica switch is D*Rp*Iref where Rp is the replica switch resistance. As a result, Iload=Rp/Rsw*Iref.

Additionally, the duty cycle estimation circuit 400 may determine the duty cycle of the buck converter power stage 250 according to the duty cycle pulse 530. Once the duty cycle D is determined, the load current $I_{OUT}$ may be estimated according to equation (1). Using the load current $I_{OUT}$, the load current comparator block 300 may detect the load current $I_{OUT}$ is less than a threshold current (e.g., 10 milliamps to 100 milliamps) even when the buck converter power stage 250 is operating in discontinuous mode and assert either the power savings entry signal 312 (PS_entry) and/or the auto entry signal 314 (Auto_entry) to control operation of the PWM controller circuit 230. Accurate detection of the load current $I_{OUT}$ in discontinuous operation mode enables the expedited entry of the buck converter power stage 250 into a power savings mode. Auto_entry is the flag to enter the low power mode which can gain some efficiency and the threshold (e.g., threshold current) should depend on the characteristic of the switch regulator's efficiency curve.

According to a further aspect of the present disclosure, a duty cycle estimation circuit of a switched mode voltage regulator is described. The duty cycle estimation circuit includes means for generating a duty cycle estimate. The means for generating the duty cycle estimate may be the combinational logic circuit 410. The circuit also includes means for receiving. The receiving means can be the comparator 430. In another aspect, the aforementioned means may be any module or any apparatus configured to perform the functions recited by the aforementioned means.

Figure 7:
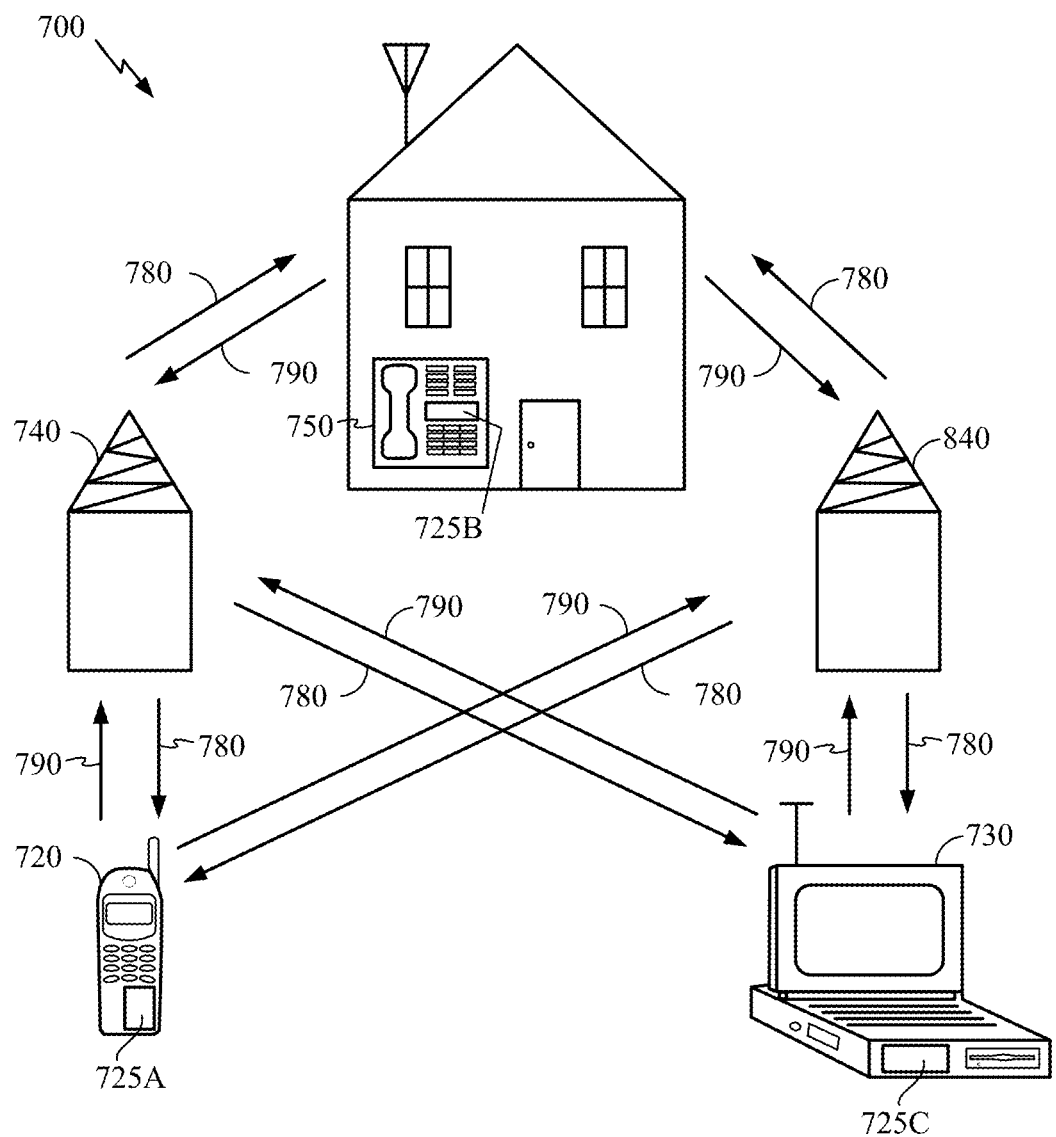
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that may include the disclosed duty cycle estimator circuit. It will be recognized that other devices may also include the disclosed duty cycle estimator circuit, such as the base stations, switching devices, and network equipment. FIG. 7 shows forward link signals 780 from the base stations 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communication systems (PCS) unit, a portable data unit such as a personal data assistants, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed duty cycle estimator circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Any reference to values is exemplary only and is intended to be non-limiting. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A duty cycle estimation circuit, comprising:
   a latch circuit configured to receive a clock signal for a voltage regulator and to output a duty cycle estimate;
   a low pass filter coupled to an output of the latch circuit to receive the duty cycle estimate;
   a comparator configured to receive, as input, an output of the low pass filter and an output of the voltage regulator, the comparator feeding back a feedback signal to the latch circuit; and
   a controller operable to determine a duty cycle of the voltage regulator according to duty cycle pulse during a discontinuous operation mode of the voltage regulator, and to estimate a load current of the voltage regulator according to the duty cycle.

2. The duty cycle estimation circuit of claim 1, in which the output of the low pass filter has a full voltage equal to the clock signal.

3. The duty cycle estimation circuit of claim 1, in which the comparator is operable to assert the feedback signal when the output of the low pass filter equals the output of the voltage regulator.

4. The duty cycle estimation circuit of claim 1, in which the latch circuit is operable to generate a rising edge of the duty cycle pulse in response to assertion of the clock signal and to generate a falling edge of the duty cycle pulse in response to assertion of the feedback signal based at least in part on an input voltage of the voltage regulator.

5. The duty cycle estimation circuit of claim 1, in which the controller is further operable to determine whether the load current is below a threshold and to switch the voltage regulator to a power savings mode when the load current is below the threshold.

6. The duty cycle estimation circuit of claim 1, in which the controller is further operable to transition the voltage regulator from a pulse width modulation (PWM) mode to a pulse frequency modulation (PFM) mode when the load current is below a threshold.

7. The duty cycle estimation circuit of claim 1, further comprising a reference generator configured to receive the duty cycle estimate and a high side transistor drive signal to determine an auto entry mode reference voltage and a power savings mode reference voltage.

8. The duty cycle estimation circuit of claim 1, in which the voltage regulator comprises a buck converter.

9. The duty cycle estimation circuit of claim 1, integrated into a mobile phone, a set top box, a music player, a video player, an entertainment unit, a navigation device, a computer, a hand-held personal communication systems (PCS) unit, a portable data unit, and/or a fixed location data unit.

10. A method of duty cycle estimation, comprising:
comparing an output voltage of a voltage regulator with a voltage ramp signal of a duty cycle estimation circuit;
determining an estimated duty cycle of a voltage regulator based at least in part on the comparing, the determining performed when a duty cycle of a switch node voltage VSW signal of the voltage regulator does not equal an output voltage (VO) divided by an input voltage (VIN) of the voltage regulator; and
estimating a load current of the voltage regulator according to the estimated duty cycle.

11. The method of claim 10, further comprising:
determining whether the load current is below a threshold current; and
switching the voltage regulator to a power savings mode when the load current is below the threshold current.

12. The method of claim 11, in which switching the voltage regulator comprises transitioning the voltage regulator from a pulse width modulation (PWM) mode to a pulse frequency modulation (PFM) mode when the load current is below the threshold current.

13. The method of claim 10, in which determining the estimated duty cycle comprises:
generating a duty cycle pulse by comparing the output voltage of the voltage regulator with the voltage ramp signal having a slope proportional to an input voltage of the voltage regulator; and
selecting the estimated duty cycle according to the duty cycle pulse.

14. The method of claim 10, further comprising integrating the voltage regulator into a mobile phone, a set top box, a music player, a video player, an entertainment unit, a navigation device, a computer, a hand-held personal communication systems (PCS) unit, a portable data unit, and/or a fixed location data unit.

15. A duty cycle estimation circuit, comprising:
means for generating a duty cycle estimate;
a low pass filter coupled to an output of the means for generating to receive the duty cycle estimate;
means for receiving, as input, an output of the low pass filter and an output from a voltage regulator, the means for receiving feeding back a feedback signal to the means for generating; and
means for determining a duty cycle of the voltage regulator according to a duty cycle pulse during a discontinuous operation mode of the voltage regulator, and means for estimating a load current of the voltage regulator according to the duty cycle.

16. The duty cycle estimation circuit of claim 15, in which the means for generating further comprises means for generating a rising edge of the duty cycle pulse in response to assertion of a clock signal and means for generating a falling edge of the duty cycle pulse in response to assertion of the feedback signal based at least in part on an input voltage of the voltage regulator.

17. The duty cycle estimation circuit of claim 16, in which the output of the low pass filter has a full voltage equal to the clock signal.

18. The duty cycle estimation circuit of claim 17, in which the means for receiving further comprise means for asserting the feedback signal when the output of the low pass filter equals the output from the voltage regulator.

19. The duty cycle estimation circuit of claim 15, in which the means for determining further comprises means for determining whether the load current is below a threshold and switching the voltage regulator to a power savings mode when the load current is below the threshold.

20. The duty cycle estimation circuit of claim 15, in which the means for determining further comprises means for transitioning the voltage regulator from a pulse width modulation (PWM) mode to a pulse frequency modulation (PFM) mode when the load current is below a threshold.

21. The duty cycle estimation circuit of claim 15, further comprising a reference generator that receives the duty cycle estimate and a high side transistor drive signal to determine an auto entry mode reference voltage and a power savings mode reference voltage.

22. The duty cycle estimation circuit of claim 15, integrated into a mobile phone, a set top box, a music player, a video player, an entertainment unit, a navigation device, a computer, a hand-held personal communication systems (PCS) unit, a portable data unit, and/or a fixed location data unit.

* * * * *